United States Patent
Xiao et al.

(10) Patent No.: US 8,050,490 B2
(45) Date of Patent: Nov. 1, 2011

(54) METHOD FOR INSPECTING OVERLAY SHIFT DEFECT DURING SEMICONDUCTOR MANUFACTURING AND APPARATUS THEREOF

(75) Inventors: Hong Xiao, Pleasanton, CA (US); Wei Fang, Milpitas, CA (US); Jack Jau, Los Altos Hills, CA (US)

(73) Assignee: Hermes Microvision, Inc., Hsin-Chu (TW)

( * ) Notice: Subject to any disclaimer, the term of this patent is extended or adjusted under 35 U.S.C. 154(b) by 387 days.

(21) Appl. No.: 12/433,762

(22) Filed: Apr. 30, 2009

(65) Prior Publication Data
US 2010/0278416 A1 Nov. 4, 2010

(51) Int. Cl.
*G06K 9/00* (2006.01)

(52) U.S. Cl. .......................... 382/151; 250/306; 250/307

(58) Field of Classification Search .................. 382/141, 382/151
See application file for complete search history.

(56) References Cited

U.S. PATENT DOCUMENTS

| 7,095,885 B1 * | 8/2006 | DeLaRosa et al. ........... 382/151 |
| 2005/0089773 A1 * | 4/2005 | Shur et al. ....................... 430/22 |

* cited by examiner

*Primary Examiner* — F. L. Evans
(74) *Attorney, Agent, or Firm* — Stout, Uxa, Buyan & Mullins, LLP

(57) ABSTRACT

A method of inspecting for overlay shift defects during semiconductor manufacturing is disclosed. The method can include the steps of providing a charged particle microscopic image of a sample, identifying an inspection pattern period in the charged particle microscopic image, averaging the charged particle microscopic image by using the inspection pattern period to form an averaged inspection pattern period, estimating an average width from the averaged inspection pattern period, and comparing the average width with a predefined threshold value to determine the presence of an overlay shift defect.

25 Claims, 8 Drawing Sheets

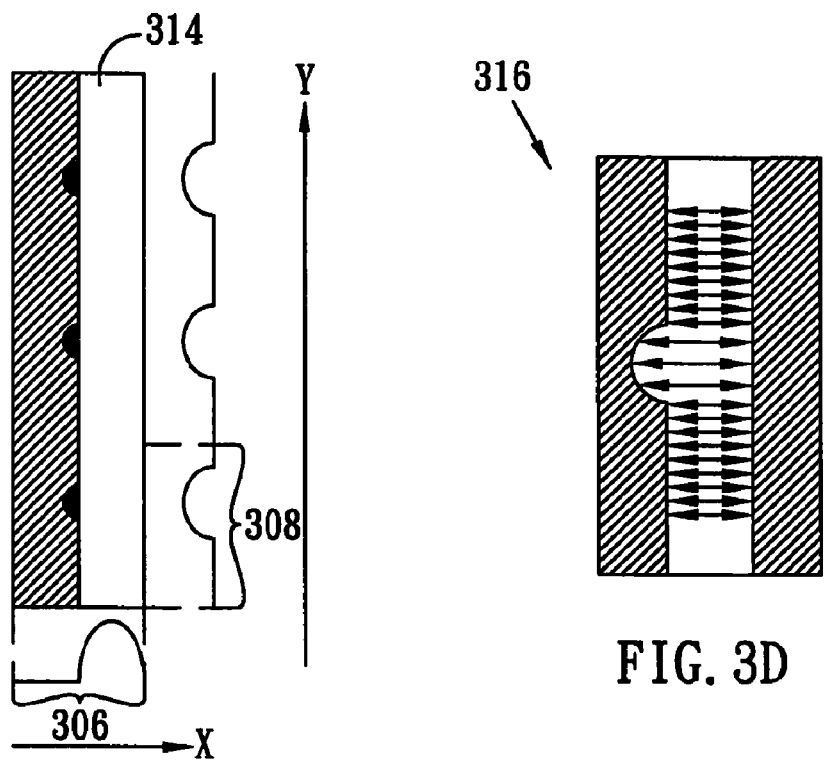
FIG. 3C
FIG. 3D
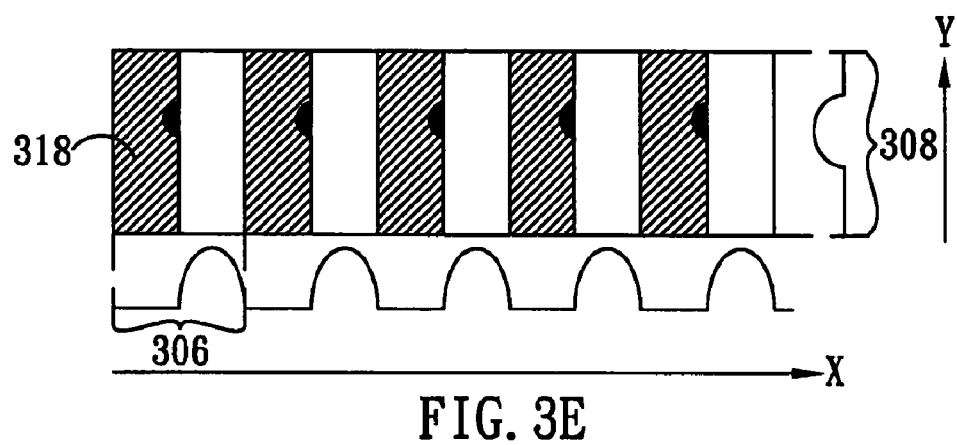
FIG. 3E
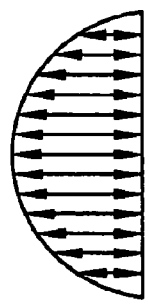
FIG. 3F ical image of the sample, with the result more or less
arbitrary and the accuracy poor.

Therefore, it is desirable to have a method for reliably and
timely (e.g., in-time) reporting the presence of overlay shift
defects after formation of a metal line on top of a contact/via
plug (typically by an etching process) in a semiconductor
device for the purpose of manufacture process control.

METHOD FOR INSPECTING OVERLAY SHIFT DEFECT DURING SEMICONDUCTOR MANUFACTURING AND APPARATUS THEREOF

BACKGROUND OF THE INVENTION

1. Field of the Invention

The present invention is related to a method of inspecting for overly shift defects during semiconductor manufacture and apparatus thereof, and more particularly, is related to a method of inspecting for overlay shift between contact/via plugs and metal lines in a semiconductor device using charged particle beam imaging.

2. Description of the Prior Art

Overlay shift is a common defect which occurs during the manufacture of semiconductor devices (such as integrated circuits). One of the major causes of the overlay shift defect stems from misalignment of photolithography masks, which are used for forming two successive layers within a semiconductor device. FIG. 1 is a cross-sectional view showing an overlay shift defect in a semiconductor device. As shown in FIG. 1, overlay shift defects can happen in various layers of a semiconductor device, for example, at the location between a contact plug 104 and a first layer metal line 102, or the location between a via plug 108 and a second layer metal line 106. Because of overlay shifting, the formed metal lines can fail to be aligned with the underlying contact/via plugs after etching. This can result in a high contact resistance between the elements. Such resistance can cause malfunction of the entire device; for example, a disconnected source/drain contact plug with the corresponding bit line can obstruct the operation of a DRAM device.

Another issue brought about by this type of defect is the manufacturing cost. As a semiconductor device is generally fabricated in a layer-by-layer fashion with one layer on top of another, a defective plug-to-contact layer should be reported immediately to enable stoppage of the process so that further waste can be avoided.

Currently, the inspection for defects on a semiconductor sample is mostly carried out through charged particle beam imaging of the sample. FIG. 2 is a schematic illustration of a typical charged particle beam microscope system 200 according to the conventional art. A charged particle beam source 210 generates a charged particle beam, and then the charged particle beam is condensed and focused by a condenser lens module 220 and an objective lens module 230, respectively, to form a charged particle beam probe 240. The formed charged particle beam probe 240 then bombards the surface of a sample 295 secured on a stage 290. Charged particle beam probe 240 is controlled by a deflection module 250 to scan the surface of sample 295. After charged particle beam probe 240 bombards the surface of sample 295, secondary charged particles 260 are induced to emit from the sample surface along with other charged particles of beam probe 240 reflected by sample 295. These particles are then detected and collected by a detector module 270. Then, detector module 270 generates a detection signal 271 accordingly. An image forming module 280 coupled to detector module 270 then receives detection signal 271 and accordingly forms a charged particle microscopic image of sample 295. In one example, the charged particles are electrons.

The presence of an overlay shift defect, however, can be difficult to detect using existing charged particle beam inspection methods and tools. Currently, monitoring for this defect is typically implemented through human observation and interpretation of a top-down view charged particle microscopic image of the sample, with the result more or less arbitrary and the accuracy poor.

Therefore, it is desirable to have a method for reliably and timely (e.g., in-time) reporting the presence of overlay shift defects after formation of a metal line on top of a contact/via plug (typically by an etching process) in a semiconductor device for the purpose of manufacture process control.

SUMMARY OF THE INVENTION

In view of the foregoing, one feature of the present invention is to provide a method of inspecting for overlay shift defects during semiconductor manufacture in order to identify overlay shift defects more efficiently.

Another feature of the present invention is to increase the accuracy of inspections for overlay shift defects thereby avoiding unnecessary waste in semiconductor manufacture.

According to the features mentioned above, a method of inspecting for overlay shift defects during semiconductor manufacture is disclosed herein and includes a step of providing a charged particle microscopic image of a sample, a step of identifying an inspection pattern period in the charged particle microscopic image, a step of averaging the charged particle microscopic image, taking the identified inspection pattern period as a unit, to reduce the image into an averaged inspection pattern period, a step of estimating an average width of the averaged inspection pattern period, and a step of comparing the average width with a predefined threshold value to determine the presence of an overlay shift defect.

According to the features presented above, a charged particle beam inspection system is disclosed herein which at least includes an image forming apparatus and an image analysis apparatus. The image forming apparatus forms charged particle microscopic images of a sample. The image analysis apparatus is coupled to the image forming apparatus to receive the charged particle microscopic images therefrom. The image analysis apparatus comprises a pattern identifying member, an image averaging member, an estimating member and a defect determination member. The pattern identifying member is used to identify an inspection pattern period from the charge particle microscopic image. The image averaging member is used to average the charged particle microscopic image, using the inspection pattern period as a unit, so as to reduce the charged particle microscopic image into an averaged inspection pattern period. The estimating member is used to estimate an average width of the averaged inspection pattern period. And the defect determination member is for determining the presence of an overlay shift defect from the charged particle microscopic image by comparing the estimated average width of the averaged inspection pattern period with a predefined threshold value.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 3A-FIG. 3F illustrate the execution of a method of inspecting for overlay shift defects in accordance with an embodiment of the present invention;

DESCRIPTION OF THE PREFERRED EMBODIMENT

A detailed description of the present invention will be presented in the following embodiments, which are not intended to limit the scope of the present invention and which can be adapted for other applications. While the drawings are illustrated in detail, it is appreciated that the quantity of the disclosed components may be greater or less than that disclosed, except for occurrences expressly restricting the amount of the components.

Figure 2:
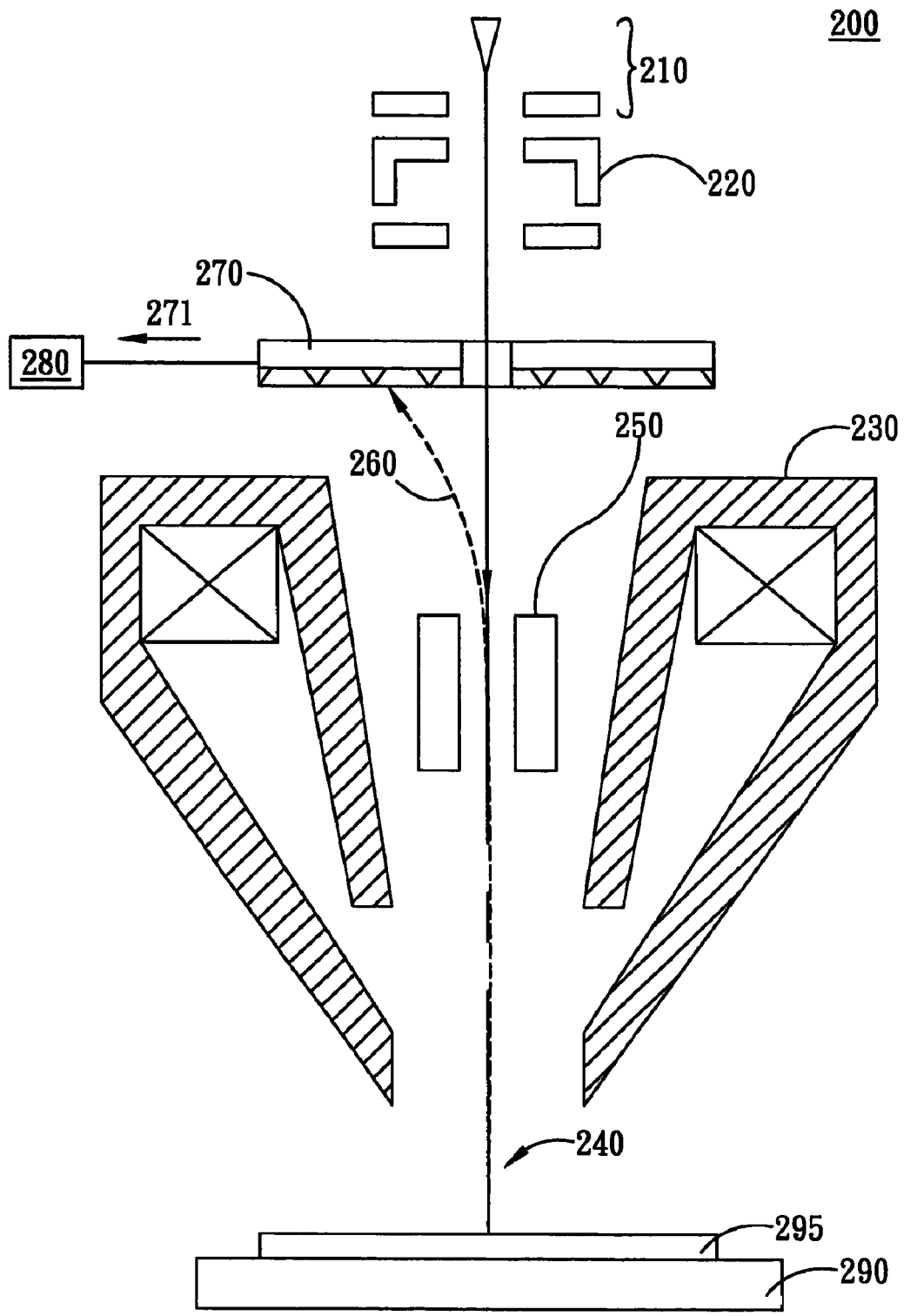
FIG. 2 is a schematic illustration of a charged particle beam microscope system 200 according to the conventional art.

As mentioned earlier, one of the major causes of overlay shift defects is the misalignment of photolithography masks, which are used for forming two successive layers within a semiconductor device. Accordingly, in one embodiment of the present invention, a method of inspecting for misalignments of photolithographic masks from a charged particle microscopic image is disclosed. The charged particle microscopic image may be obtained by a conventional charged particle microscope system such as that described above in conjunction with FIG. 2. FIG. 3A-FIG. 3F and FIG. 4 are, respectively, an illustration of the execution and flowchart of the disclosed inspection method.

Figure 1:
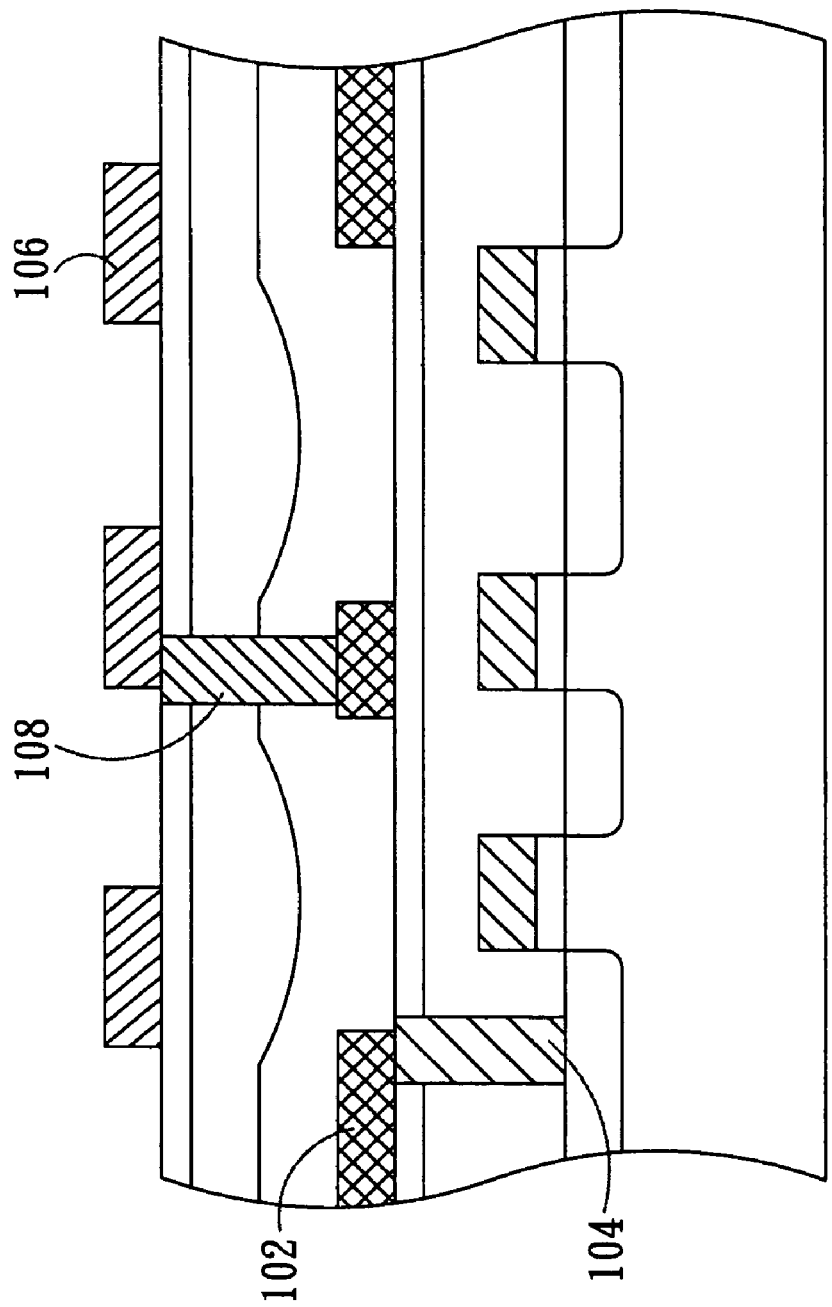
FIG. 1 is a cross-sectional view showing an overlay shift defect in a semiconductor device.
Figure 3A:
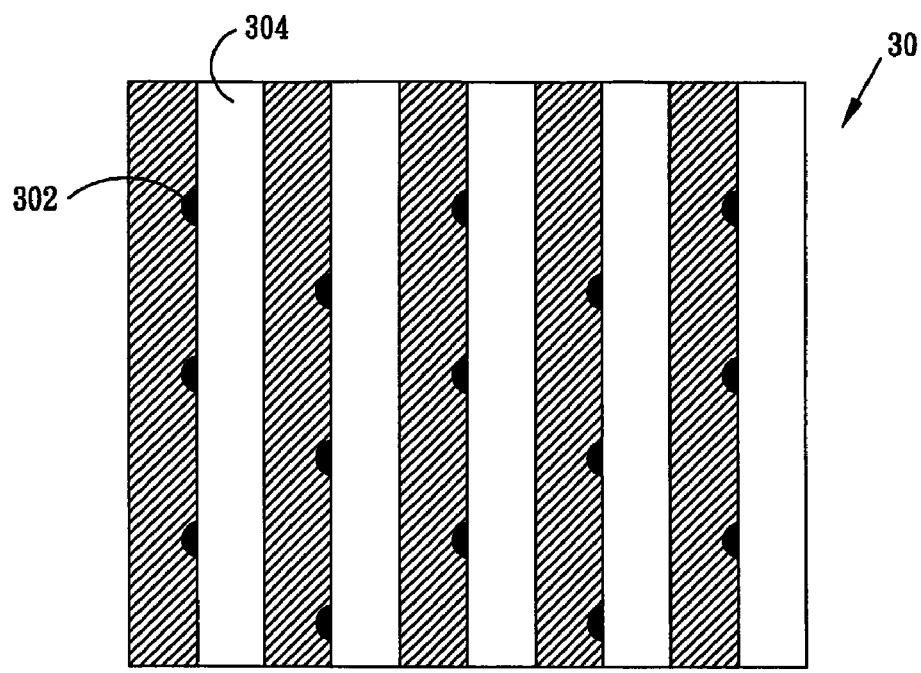

FIG. 3A is a top view schematic view showing a charged particle microscopic image of a wafer. The charged particle microscopic image 30 represents the top view of a layered structure such as that in FIG. 1 in order to detect the overlay shift defect between a contact/via plug and a metal line in a semiconductor device, for example, a dynamic random access memory (DRAM). As shown in FIG. 3A, microscopic image 30 comprises protruding elements 302 extending from line elements 304. This is due to the inaccuracy in aligning the successive masks during formation of the structures represented by elements 302 and 304. In other words, overlay shift is typically unavoidable; it is the degree of shift that is estimated to determine whether a "defect" is present. The protruding elements 302 and the line elements 304 in the charged particle microscope image 30 respectively represent the contact/via plugs and metal lines in the semiconductor device sample. It is noted that microscopic image 30 in FIG. 3A is a high resolution charged particle microscopic image of the sample. In practice, it may also be in another format such as a voltage contrast (VC) image, where elements 302 and 304 are represented in pixel grey levels.

For the purpose of detecting an overlay shift defect (misalignment of photolithographic masks), one of the advantages of the disclosed method is to eliminate human interpretation of charged particle microscopic images of the sample being inspected, by employing imaging processing approaches, instead, to achieve the same goal of inspection. To do this, an important step is to identify a repeating pattern period unit from the image, so that further analysis of this unit can be carried out through image processing. This can be done in two ways: (1) projecting the imaged pattern (elements 302 and 304) to at least two arbitrary axes, for example, the x and y axis shown in FIG. 3B, to identify a pattern period along respective axis; or (2) if a pattern specification, for example a GDS file or database layout of the sample being inspected is available, the specification can be used as a reference to identify pattern periods, for example again, respectively along at least two arbitrary axes, such as the x and y axis shown in FIG. 3B. Then, a proper inspection pattern period can be identified by observing these sub-pattern periods.

Figure 3B:
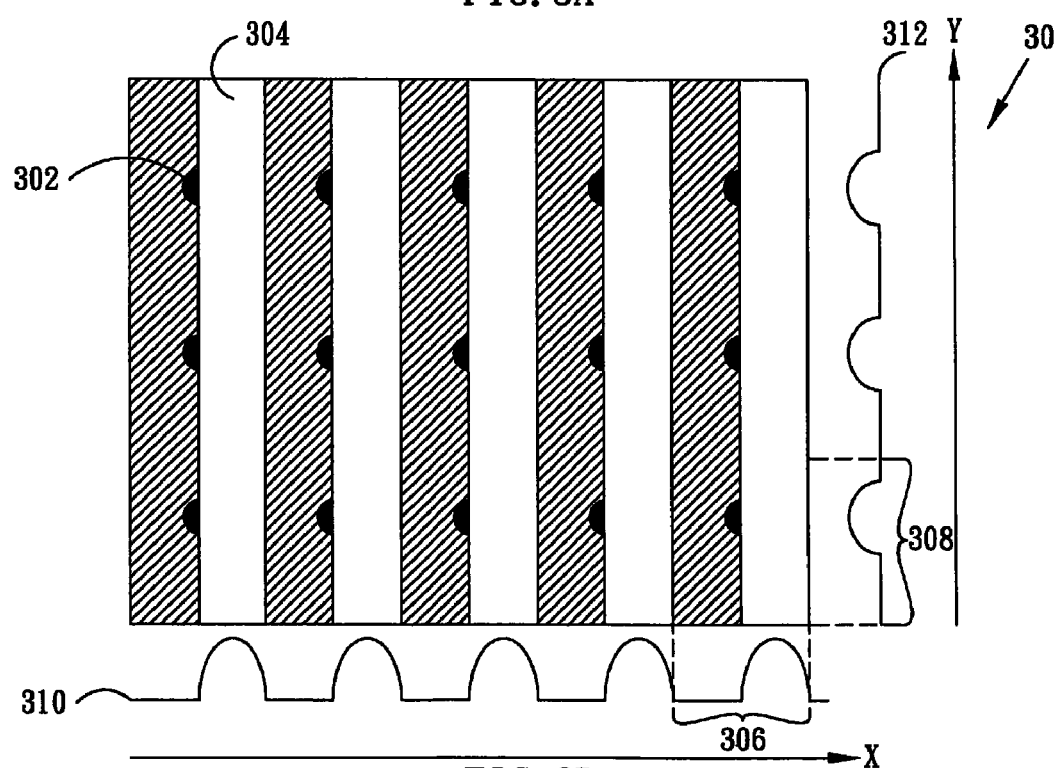

FIG. 3B illustrates the above method (1). In detail, method (1) adds up the pixel grey level along individual horizontal lines (i.e. along x direction) to obtain a projection of the imaged patterns (elements 302 and 304) on the y axis in the form of a grey level profile 312. Similarly, the pixel grey level along individual vertical lines (i.e. along y direction) is added up to obtain a projection of elements 302 and 304 on the x axis in the form of a grey level profile 310. Next, by observing the periodic variation in the x profile 310, an x pattern period (pattern period along the x direction) 306 is obtained. Similarly, a y pattern period 308 can be obtained by observing the y pattern period 312. It is noted that during the addition operation along horizontal or vertical lines, the background noises can cancel each other out because these noises turn up randomly in both positive signals and negative signals. This cancellation effect will be referred to as the "averaging" of the background noises hereinafter. Averaging can be applied in images too.

It is noted that in practice, the imaged pattern (elements 302 and 304) may not be so perfectly aligned as shown in FIG. 3A and FIG. 3B. In the case of irregularly distributed pattern columns, the pattern columns in the image may first be shifted or re-arranged to align with each other. Such adjustment can be easily done with current imaging processing techniques and will not be described in detail here.

It is also noted that for method (2) to be performed, a specification must be provided, for example, by the customer. Such specification should explicitly indicate that, for example, for a 512×512 image, every 10 pixels along the x direction gives an x pattern period, and every 15 pixels along the y direction gives a y pattern period. Then, the x and y pattern period can be identified directly from the image.

As mentioned earlier, after individual pattern periods 306/308 along the x and y direction have been found, an inspection pattern period can be defined and obtained, and then microscopic image 30 can be averaged using this inspection pattern period. Still referring to FIG. 3B, in this embodiment, microscopic image 30 can first be divided into a plurality of x periods 306. The individual x periods 306 are then added up along the x direction. As a result, a single x period 314 with x-averaged background image noises is obtained, as shown in FIG. 3C. Next, this averaged x period 314 is divided into individual y pattern periods 308, which are then added along the y direction to form a y-averaged (recall: now also x-averaged) y pattern period 316, as shown in FIG. 3D. It is noted that the order of the above operation along the x and y directions is exchangeable; for example, as shown in FIG. 3E, microscopic image 30 is first averaged along the y-direction to form a row of y periods 308 with y-averaged background noises, denoted as 318, and then this row 318 of averaged y pattern periods 308 is averaged along the x-direction, taking x period 306 as a unit, to form the same pattern period 316 in FIG. 3D. In other words, by either way, microscopic image 30 is reduced into pattern period 316 which is both x-averaged and y-averaged. This final pattern period 316 is selected to be the inspection pattern period.

Clearly, as shown in FIG. 3D, inspection pattern period 316 is preferably selected to include the line-to-plug connection/contact point that is sought to be inspected.

After inspection pattern period 316 has been identified, the width of inspection pattern period 316 can be measured to determine the degree of average overlay shift between the contacting plug and metal line included in inspection pattern period 316, thereby determining if the shift is within a tolerable range. For example, the average width of inspection pattern period 316 can be compared with a threshold value, and if the average width of inspection pattern period 316 is equal to or greater than this threshold value, it is determined that an intolerable overlay shift is present; therefore, an overlay shift defect is present in the sample being inspected. The threshold value may be provided by the customer.

In an alternative embodiment, modification is made to inspection pattern period 316 to further facilitate the determination step. For example, the image of line element 304 can be subtracted from inspection pattern period 316, so that only the exposing protruding element 302 remains for analysis, as shown in FIG. 3F. It is noted that although a 2-dimensional pattern period identification approach is described in this embodiment, it would be understood by those skilled in the field of image processing that multi-dimensional pattern period identification can also be implemented to achieve the same goal of finding inspection pattern period 306.

Figure 4:
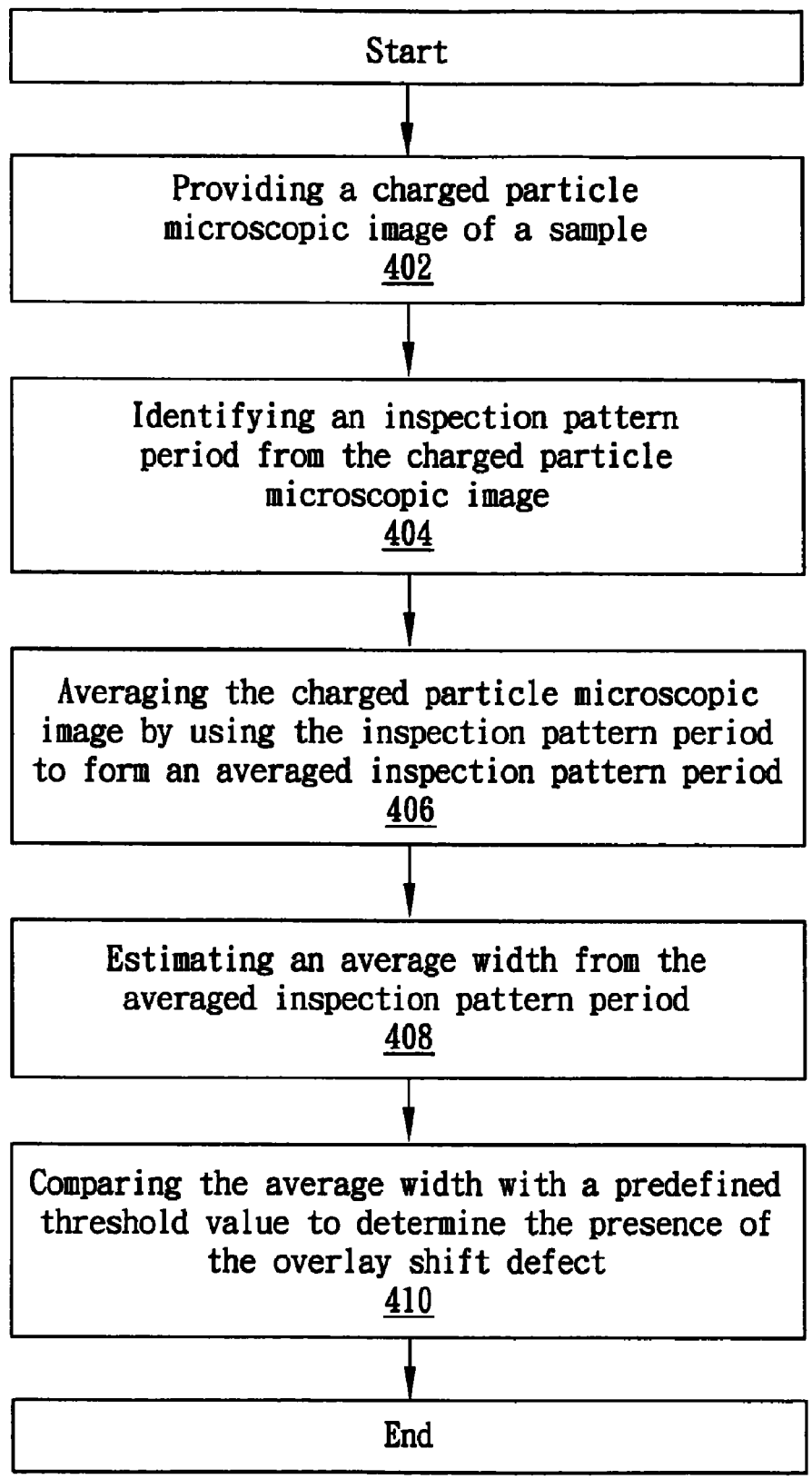
FIG. 4 is a flowchart illustration of a method of inspecting for overlay shift defects in accordance with an embodiment of the present invention.

FIG. 4 is a flowchart diagram illustrating the disclosed method of inspecting for overlay shift defects during semiconductor manufacture in accordance with an embodiment of the present invention. As shown in FIG. 4, the method includes the following steps. In step 402, a charged particle microscopic image of a sample is provided. The sample may be a semiconductor device, such as a dynamic random access memory (DRAM). In step 404, an inspection pattern period is identified from the charged particle microscopic image. In step 406, the charged particle microscopic image is averaged by using the inspection pattern period as a unit to form an averaged inspection pattern period. In step 408, an average width is estimated from the averaged inspection pattern period. Then, in step 410, the average width is compared with a predefined threshold value to determine whether an overlay shift defect is present.

Still referring to FIG. 4, in one embodiment the identifying step further comprises observing a grey level profile of the patterns displayed in the image. In another embodiment, the identifying step further comprises identifying at least two independent pattern periods, each along a direction predefined in the image. In this case, the inspection pattern period comprises an overlapped portion of the identified independent pattern periods, just as with inspection period 316 including an overlapped portion of x and y periods 306 and 308, as illustrated in FIG. 3. To obtain these independent pattern periods, the pixel grey level in the image is added up along each of the predefined directions to obtain a corresponding grey level profile. Then, the independent pattern periods are identified by observing a periodic variation in the obtained grey level profiles.

In one example of this embodiment, a first and second pattern period along a first and second direction predefined in the image is respectively identified, just as with the acquisition of x and y periods 306 and 308 as illustrated in FIG. 3. For instance, the pixel grey level of the image may be added along the first direction to obtain a first grey level profile and along the second direction to obtain a second grey level profile. The first and second directions may be substantially perpendicular to each other, as with the x and y directions as illustrated in FIG. 3. In this case, as described earlier in conjunction with FIG. 3, projection along the first (e.g., x) direction forms a grey level profile on the second axis (first grey level profile). Therefore, the first grey level profile is along the second (e.g., y) direction. Similarly, projection along the second direction forms a second grey level profile on the first axis (second grey level profile). Therefore, the second grey level profile is along the first direction. Next, the first pattern period is identified by observing a periodic variation in the second grey level profile, and the second pattern period is identified by observing a periodic variation in the first grey level profile. The inspection pattern period again includes an overlapped portion of the identified first and second pattern period.

After the inspection pattern period is identified, in the averaging step the pixel grey level may be added up, pixel by pixel, over the entire image taking the inspection pattern period as a unit of addition. For example, the pixel grey level may be added along the first and then the second direction, or the second and then the first direction, respectively.

The inspection pattern period may comprise a contact point of a contact/via plug with a conducting line formed in successive layer structures as part of the sample. In such case, for the purpose of inspecting for overlay shift defects, the image of the sample should be taken after the formation of the two successive layer structures, with one on top of the other, as part of the sample. Moreover, the upper layer structure should comprise the conducting line and the bottom layer structure should comprise the contact/via plug. In one embodiment, the sample is a dynamic random access memory (DRAM) device which comprises the above layered structures.

Figure 5:
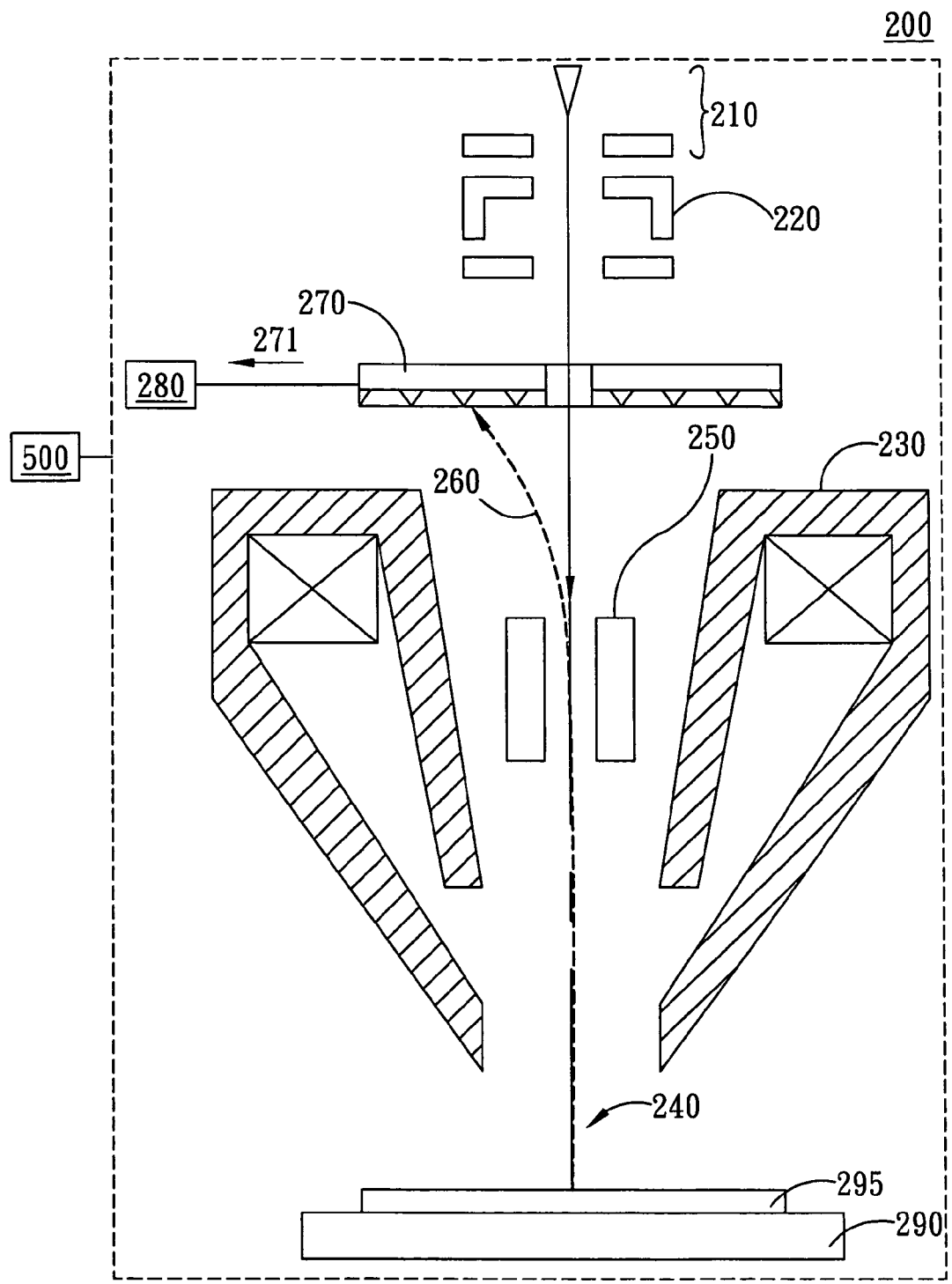
FIG. 5 illustrates a computing agent coupled to a conventional charged particle microscope system in accordance with an embodiment of the present invention.

In one embodiment, the disclosed method is implemented as or by an independent computing agent which is able to analyze images taken by a general/conventional charged particle beam microscope system. FIG. 5 illustrates a computing agent 500 coupled to the conventional charged particle microscope system 200 of FIG. 2. In one example of the present invention, computing agent 500 is coupled to image forming module 280 of charged particle microscope system 200 for receiving images of the sample being inspected (sample 295) therefrom. Computing agent 500 may be implemented in hardware, firmware, software, or any combination thereof. For example, it may be implemented as an independent integrated circuit (IC), or a computer readable medium encoded with a computer program which is able to execute the steps of the disclosed method.

Figure 6:
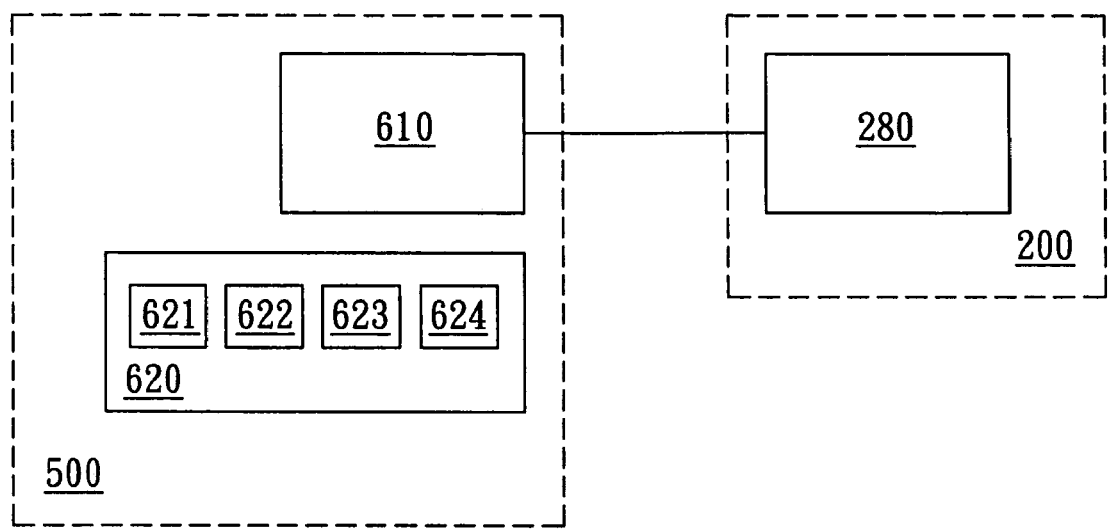
FIG. 6 is a schematic block diagram of a computing agent in accordance with an embodiment of the present invention.

Referring to FIG. 6, a schematic block diagram of computing agent 500 in accordance with an embodiment of the present invention is shown which may comprise an input module 610 and a computing module 620. Input module 610 may be used to couple to, for example, image forming module 280 of charged particle microscope system 200, so that computing agent 500 receives images of the interested sample 295 from charged particle microscope system 200. Computing module 620 is coupled with input module 610 to receive information of the images therefrom for further processing and analysis. As depicted in FIG. 6, computing module 620 may comprise a pattern identifying member 621, an image averaging member 622, an estimating member 623, and a defect determination member 624. The pattern identifying member 621 is used for identifying an inspection pattern period from the image. The image averaging member 622 is used for averaging the image taking the identified inspection pattern period as a unit so as to reduce the image into an averaged inspection pattern period. The estimating member 623 is used for estimating an average width of the averaged inspection pattern period. The defect determination member 624 is used for comparing the estimated average width with a threshold value thereby determining the presence of misalignment of the successive photolithographic masks. If the average width is equal to or greater than the threshold value, it is determined that misalignment of the successive photolithographic masks is present. Otherwise, no such determination is made, and/or, it is determined that misalignment of the successive photolithographic masks is not present.

Figure 7:
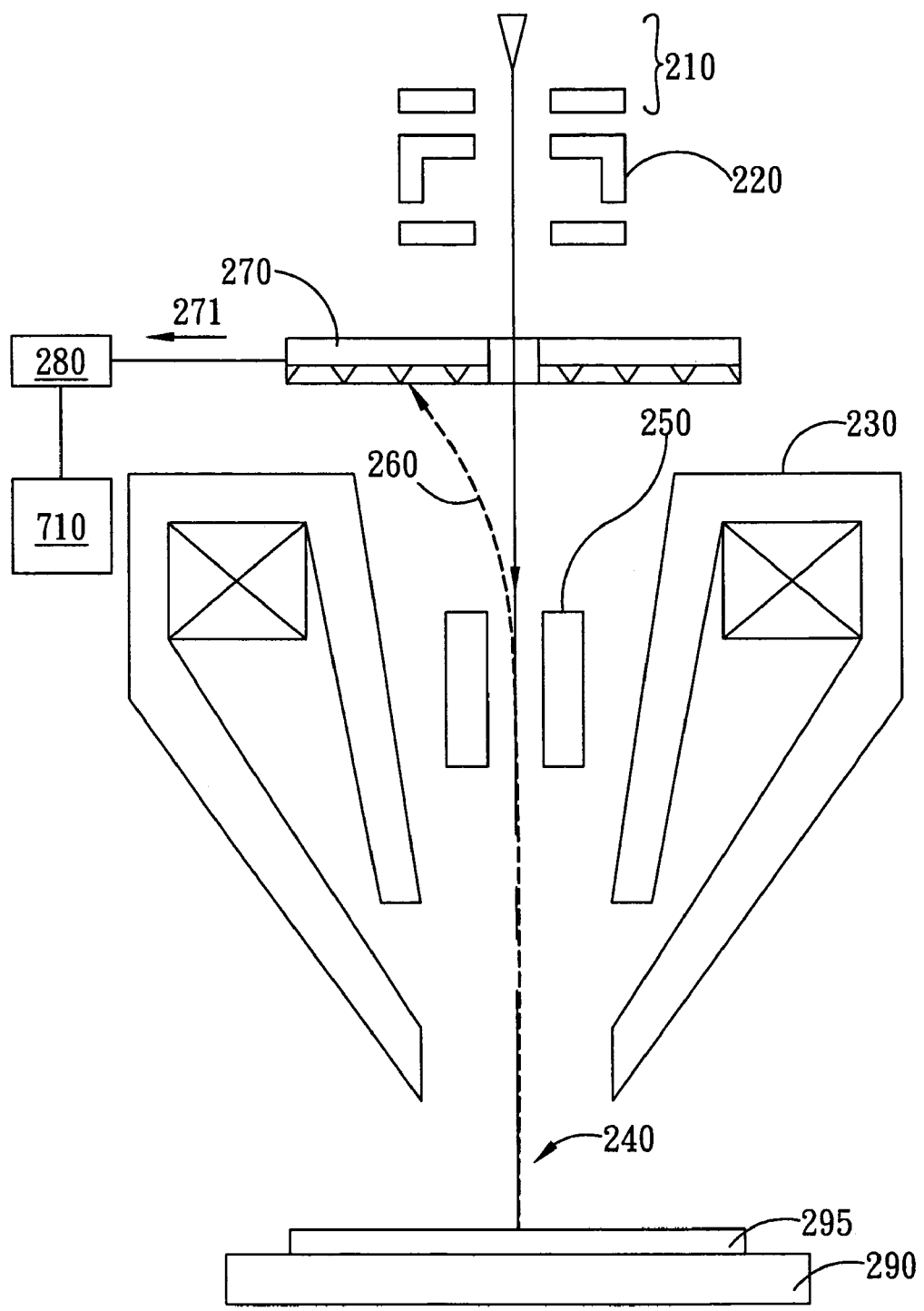
FIG. 7 is an illustration of a charged particle beam inspection system in accordance with an embodiment of the present invention.

In one embodiment, a charged particle inspection system capable of inspecting for misalignments of photolithographic masks from a charged particle microscopic image is disclosed. FIG. 7 is an illustration of a charged particle beam inspection system 700 in accordance with an embodiment of the present invention. As shown, charged particle beam inspection system 700 comprises a conventional charged particle microscope system, such as charged particle microscope system 200 described in conjunction with FIG. 2 and an image analysis apparatus 710 coupled thereto. Since details of the physical design and operation of the charged particle microscope system 200 have been described earlier, they are not repeated here.

Image analysis apparatus 710 may be implemented in hardware, firmware, software, or any combination thereof. For example, it may be implemented as an independent IC, or a computer readable medium encoded with a computer program which is able to execute the steps of the disclosed inspection method. It is noted that when implemented in hardware, the physical design and operation of image analysis apparatus 710 may be an implementation similar to that of the computing agent 500 as described earlier in conjunction with FIG. 5 and FIG. 6.

Although specific embodiments have been illustrated and described, it will be appreciated by those skilled in the art that various modifications may be made without departing from the scope of the present invention, which is intended to be limited solely by the appended claims.

What is claimed is:

1. A method of inspecting a charged particle microscopic image for misalignment of photolithographic masks, comprising:
   providing a charged particle microscopic image of a sample, said image representing at least two different patterns formed as part of said sample by using two successive photolithographic masks;
   identifying an inspection pattern period from said image, said inspection pattern period comprising a contact point of said two patterns;
   averaging said image taking said inspection pattern period as a unit so as to reduce said image into an averaged inspection pattern period;
   estimating an average width of the averaged inspection pattern period; and
   comparing said average width with a threshold value thereby determining the presence of misalignment of said successive photolithographic masks,
   wherein if said average width is equal to or greater than said threshold value it is determined that misalignment of said successive photolithographic masks is present, and otherwise it is not determined that misalignment of said successive photolithographic masks is present.

2. The method of claim 1, wherein said identifying step further comprises observing a grey level profile of said patterns displayed in said image.

3. The method of claim 1, wherein:
   said identifying step further comprises identifying at least two independent pattern periods along respective corresponding directions predefined in said image, and
   said inspection pattern period comprises an overlapped portion of said independent pattern periods.

4. The method of claim 3, wherein:
   said identifying step further comprises adding up a pixel grey level along each of said directions to obtain a corresponding grey level profile, and
   said independent pattern periods are identified by observing a periodic variation in said grey level profiles.

5. The method of claim 1, wherein:
   said identifying step further comprises identifying a first and second pattern period along a first and second direction predefined in said image, and
   said inspection pattern period comprises an overlapped portion of said first and second pattern period.

6. The method of claim 5, wherein said identifying step further comprises:
   adding up a pixel grey level along said first direction to obtain a first grey level profile along said second direction; and
   adding up said pixel grey level along said second direction to obtain a second grey level profile along said first direction,
   wherein said first pattern period is identified by observing a periodic variation in said second grey level profile, and said second pattern period is identified by observing a periodic variation in said first grey level profile.

7. The method of claim 5, wherein said first and second directions are substantially perpendicular to each other.

8. The method of claim 1, wherein said averaging step further comprises adding up a pixel grey level over said image taking said inspection pattern period as a unit of addition.

9. The method of claim 1, wherein said averaging step further comprises adding up a pixel grey level respectively along a first and a second direction taking said inspection pattern period as a unit of addition.

10. The method of claim 9, wherein said first and second directions are substantially perpendicular to each other.

11. The method of claim 1, wherein said inspection pattern period in said image comprises a contact point of a contact/via plug with a conducting line formed in successive layer structures as part of said sample.

12. The method of claim 1, wherein said image of said sample is taken after formation of two successive layer structures, with one on top of the other, as part of said sample, and wherein the upper layer structure comprises a conducting line and the bottom layer structure comprises a contact/via plug.

13. The method of claim 1, wherein said sample comprises a Dynamic Random Access Memory (DRAM).

14. A charged particle beam inspection system, comprising:
   an image forming apparatus for forming a charged particle microscopic image of a sample, said image representing at least two different patterns formed as part of said sample by using two successive photolithographic masks;
   an image analysis apparatus coupled with said image forming apparatus for receiving said image therefrom, said image analysis apparatus comprising:
     a pattern identifying member for identifying an inspection pattern period from said image, said inspection pattern period comprising a contact point of said two patterns;
     an image averaging member for averaging said image taking said inspection pattern period as a unit so as to reduce said image into an averaged said inspection pattern period;
     an estimating member for estimating an average width of averaged said inspection pattern period; and a defect determination member for comparing said average width with a threshold value thereby determining the presence of misalignment of said successive photolithographic masks, wherein if said average width is equal to or greater than said threshold value it is determined that misalignment of said successive photolithographic masks is present and otherwise it is determined that misalignment of said successive photolithographic masks is not present.

15. The system of claim 14, wherein:

said pattern identifying member identifies a first and second pattern period along a first and second direction predefined in said image, and said inspection pattern period comprises an overlapped portion of said first and second pattern period.

16. The system of claim 15, wherein:

said pattern identifying member adds up a pixel grey level along said first and second direction to obtain a first grey level profile along said second direction and a second grey level profile along said first direction, said first pattern period is identified by observing a periodic variation in said second grey level profile, and said second pattern period is identified by observing a periodic variation in said first grey level profile.

17. The system of claim 15, wherein said first and second directions are substantially perpendicular to each other.

18. The system of claim 14, wherein said image averaging member adds up a pixel grey level over said image taking said inspection pattern period as a unit of addition.

19. The system of claim 14, wherein said image of said sample is taken after formation of two successive layer structures as part of said sample with one on top of the other, and wherein the upper layer structure comprises a conducting line and the bottom layer structure comprises a contact/via plug.

20. A computing agent for inspecting a charged particle microscopic image for misalignment of photolithographic masks, comprising:

an input module coupled with a charged particle beam microscope system for receiving therefrom a charged particle microscopic image of a sample, said image being formed by said charged particle beam microscope system and said image representing at least two patterns formed as part of said sample by using two successive photolithographic masks;

a computing module coupled with said input module for receiving information of said image therefrom, said computing module comprising:

a pattern identifying member for identifying an inspection pattern period from said image, said inspection pattern period comprising a contact point of two said patterns;

an image averaging member for averaging said image taking said inspection pattern period as a unit so as to reduce said image into an averaged said inspection pattern period;

an estimating member for estimating an average width of averaged said inspection pattern period; and a defect determination member for comparing said average width with a threshold value thereby determining the presence of misalignment of said successive photolithographic masks, wherein if said average width is equal to or greater than said threshold value a determination is made that misalignment of said successive photolithographic masks is present, and otherwise misalignment of said successive photolithographic masks is not determined to be present.

21. The computing agent of claim 20, wherein:

said pattern identifying member identifies a first and second pattern period along a first and second direction predefined in said image, and said inspection pattern period comprises an overlapped portion of said first and second pattern period.

22. The computing agent of claim 21, wherein:

said pattern identifying member adds up a pixel grey level along said first and second direction to obtain a first grey level profile along said second direction and a second grey level profile along said first direction, said first pattern period is identified by observing a periodic variation in said second grey level profile, and said second pattern period is identified by observing a periodic variation in said first grey level profile.

23. The computing agent of claim 21, wherein said first and second directions are substantially perpendicular to each other.

24. The computing agent of claim 20, wherein said image averaging member adds up a pixel grey level over said image taking said inspection pattern period as a unit of addition.

25. The computing agent of claim 20, wherein:

said image of said sample is taken after formation of two successive layer structures as part of said sample with one on top of the other, and the upper layer structure comprises a conducting line and the bottom layer structure comprises a contact/via plug.

* * * * *